US012672248B2

(12) United States Patent
Tian et al.

(10) Patent No.: US 12,672,248 B2
(45) Date of Patent: Jun. 30, 2026

(54) DISPLAY MODULE AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Lijun Tian, Wuhan (CN); Wen Han, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 140 days.

(21) Appl. No.: 18/692,343

(22) PCT Filed: Jan. 4, 2024

(86) PCT No.: PCT/CN2024/070500
§ 371 (c)(1),
(2) Date: Mar. 15, 2024

(87) PCT Pub. No.: WO2025/138314
PCT Pub. Date: Jul. 3, 2025

(65) Prior Publication Data
US 2025/0254810 A1      Aug. 7, 2025

(30) Foreign Application Priority Data

Dec. 27, 2023      (CN) .......................... 202311825642.0

(51) Int. Cl.
*H05K 5/03*          (2006.01)

(52) U.S. Cl.
CPC ..................................... *H05K 5/03* (2013.01)

(58) Field of Classification Search
CPC ............................... H05K 5/03; H05K 5/0217
(Continued)

(56) References Cited

U.S. PATENT DOCUMENTS

2012/0075823 A1*  3/2012  Park ..................... H10K 59/872
                                                      361/784
2015/0103474 A1*  4/2015  Cho ......................... H05K 5/03
                                                      361/679.01

(Continued)

FOREIGN PATENT DOCUMENTS

CN          112449033 A        3/2021
CN          115207037 A        10/2022
(Continued)

OTHER PUBLICATIONS

International Search Report in International application No. PCT/CN2024/070500, mailed on Sep. 11, 2024.
(Continued)

*Primary Examiner* — Hung S. Bui
(74) *Attorney, Agent, or Firm* — PV IP PC; Peter Stecher; Wei Te Chung

(57)          ABSTRACT

The present disclosure provides a display module and a display device. A side of the cover plate close to the display panel is provided with a bonding surface. The bonding surface includes a first plane and a first curved surface connected to a periphery of the first plane. A side of the first curved surface close to the first plane is provided with a bonding arc area. In the bonding arc area, a mean radius of curvature in an area where a corner curved surface is away from side curved surfaces connected thereof is greater than a mean radius of curvature of an area where the corner curved surface is close to the side curved surfaces connected thereof.

20 Claims, 4 Drawing Sheets

(58) Field of Classification Search
USPC .......................................... 361/807, 809, 810
See application file for complete search history.

(56) References Cited

U.S. PATENT DOCUMENTS

2018/0368270 A1* 12/2018 Seo ............................ G06F 1/16
2022/0115621 A1* 4/2022 Wang ................... H10K 77/111

FOREIGN PATENT DOCUMENTS

| | | |
|---|---|---|
| CN | 115244600 | 12/2023 |
| WO | 2021184331 A1 | 9/2021 |

OTHER PUBLICATIONS

Written Opinion of the International Search Authority in International application No. PCT/CN2024/070500, mailed on Sep. 11, 2024.

* cited by examiner 322 (32)

321 (32)

31 (30)

20  10

DISPLAY MODULE AND DISPLAY DEVICE

CROSS-REFERENCE TO RELATED APPLICATIONS

This application is a US national phase application based upon an International Application No. PCT/CN2024/070500, filed on Jan. 4, 2024, which claims priority to and the benefit of Chinese Patent Application No. 202311825642.0, filed on Dec. 27, 2023. The entire disclosures of the aforementioned applications are incorporated herein by reference in their entireties.

TECHNICAL FIELD

The present disclosure relates to a technical field of display, and in particular to a display module and a display device.

BACKGROUND

With changes in people's aesthetic level and the development of mobile terminal products, people gradually pursue the appearance of mobile terminals with rounded curves. Numerous curved screen terminals have emerged in the market. At present, two sides of multi-curved screens are curved surfaces, namely double curved surfaces. Hyperbolic products are numerous and technological research is becoming increasingly sophisticated. However, due to their advantages such as more beautiful curves, differentiated appearance, and no borders on all sides, four curved screens have gradually become a market hotspot and an inevitable trend in the development of the mobile terminals.

In the four curved screens, curved surface areas are prone to wrinkling, especially in corner areas.

SUMMARY

The present disclosure provides a display module and a display device to reduce a probability of wrinkling in curved surface areas of four curved display panels.

An embodiment of the present disclosure provides a display module including:

a display panel; and a cover plate, disposed on a side of the display panel, a side of the cover plate close to the display panel is provided with a bonding surface that includes a first plane and a first curved surface connected to a periphery of the first plane, and the display panel is bonded with the first plane and the first curved surface;

one end of the first curved surface is connected to the first plane, and another end of the first curved surface bends toward a side close to the display panel; the first curved surface includes a plurality of side curved surfaces and a corner curved surface connected between two adjacent side curved surfaces, and a side of the first curved surface close to the first plane is provided with a bonding arc area; in the bonding arc area, a mean radius of curvature in an area where the corner curved surface is away from the side curved surfaces connected thereof is greater than a mean radius of curvature of an area where the corner curved surface is close to the side curved surfaces connected thereof.

According to the above object of the present disclosure, an embodiment of the present disclosure further provides a display device including a display module. The display module includes:

a display panel; and a cover plate, disposed on a side of the display panel, a side of the cover plate close to the display panel is provided with a bonding surface that includes a first plane and a first curved surface connected to a periphery of the first plane, and the display panel is bonded with the first plane and the first curved surface;

one end of the first curved surface is connected to the first plane, and another end of the first curved surface bends toward a side close to the display panel; the first curved surface includes a plurality of side curved surfaces and a corner curved surface connected between two adjacent side curved surfaces, and a side of the first curved surface close to the first plane is provided with a bonding arc area; in the bonding arc area, a mean radius of curvature in an area where the corner curved surface is away from the side curved surfaces connected thereof is greater than a mean radius of curvature of an area where the corner curved surface is close to the side curved surfaces connected thereof.

DETAILED DESCRIPTION

Figure 1:
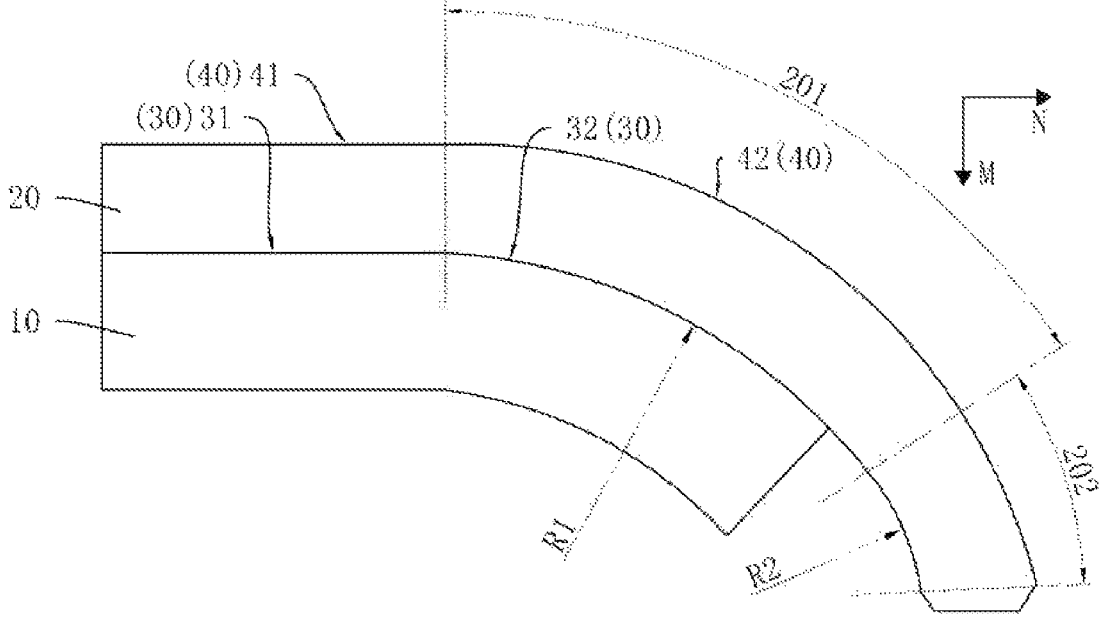
FIG. 1 is a partial structural schematic diagram of a display module provided by an embodiment of the present disclosure.

The technical solutions in the embodiments of the present disclosure will be described clearly and completely hereafter with reference to accompanying drawings. Apparently, the described embodiments are only a part of but not all embodiments of the present disclosure. All other embodiments obtained by persons of ordinary skill in the art based on the embodiments of the present disclosure without creative efforts shall fall within the protection scope of the present disclosure.

Various embodiments and examples are provided in the following description to implement different structures of the present disclosure. In order to simplify the present disclosure, certain elements and settings will be described. However, these elements and settings are only by way of example and are not intended to limit the present disclosure. In addition, reference numerals may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied.

Figure 2:
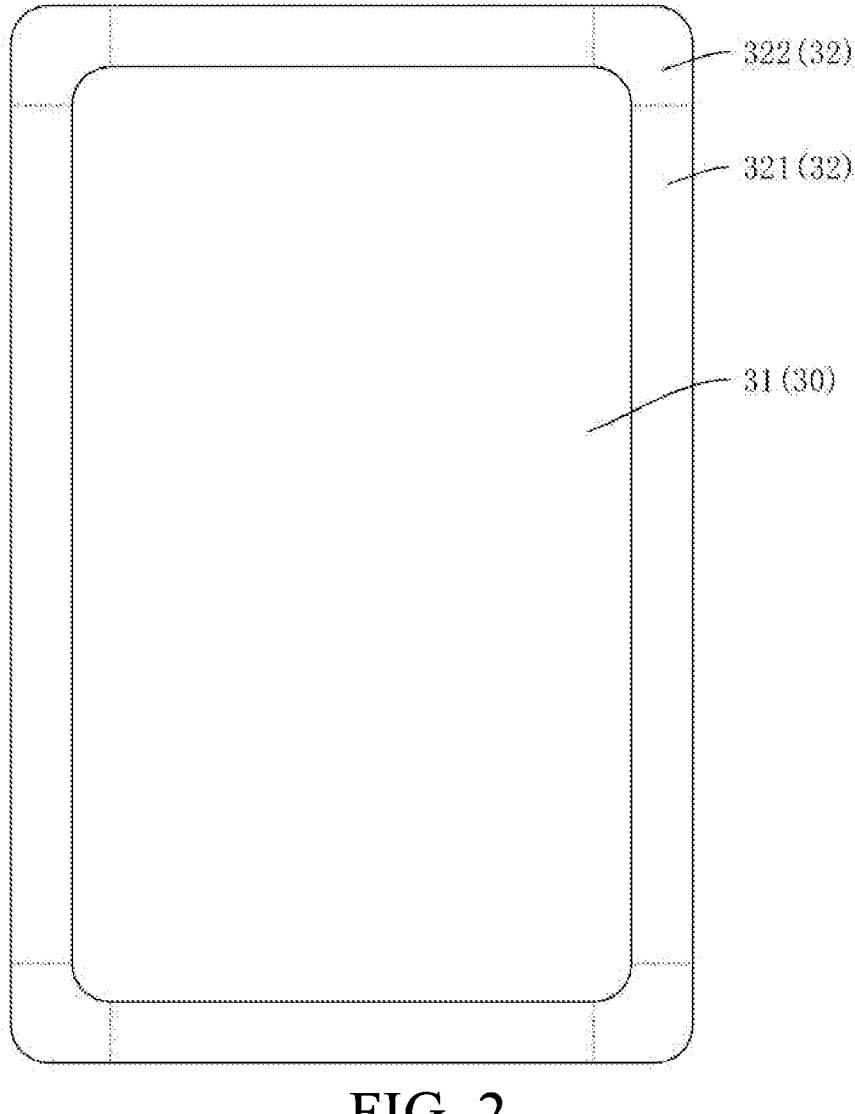
FIG. 2 is a structural schematic diagram of a cover plate provided by an embodiment of the present disclosure.

The embodiment of the present disclosure provides a display module. Referring to FIG. 1 and FIG. 2, the display module includes a display panel 10 and a cover plate 20 disposed on a side of the display panel 10. A side of the cover plate 20 close to the display panel 10 is provided with a bonding surface 30. The bonding surface 30 includes a first plane 31 and a first curved surface 32 connected to a periphery of the first plane 31. The display panel 10 is bonded with the first plane 31 and the first curved surface 32.

One end of the first curved surface 32 is connected to the first plane 31, and another end of the first curved surface 32 bends toward a side close to the display panel 10. The first curved surface 32 includes a plurality of side curved surfaces 321 and a corner curved surface 322 connected between two adjacent side curved surfaces 321. A side of the first curved surface 32 close to the first plane 31 is provided with a bonding arc area 201. In the bonding arc area 201, a mean radius of curvature in an area where the corner curved surface 322 is away from the side curved surfaces connected thereof is greater than a mean radius of curvature of an area where the corner curved surface 322 is close to the side curved surfaces 321 connected thereof.

During the process of implementing applications, the radius of curvature of the corner curved surface 322 is designed differently in the embodiment of the present disclosure, so that in the bonding arc area 201, the mean radius of curvature of the corner curved surface 322 away from the side curved surfaces 321 is greater than the mean radius of curvature of the corner curved surface 322 close to the side curved surfaces 321, thereby reducing a compression amount of the display panel 10 at the corner curved surface 322. The closer the position is to the center of the corner curved surface 322, the greater the reduction of the compression amount of the display panel 10, thereby reducing a probability of wrinkling when bonding between the display panel 10 and the corner curved surface 322 and improving a yield of the display module.

In one embodiment of the present disclosure, in the bonding arc area, the corner curved surface includes a plurality of sub-parts. One end of each of the plurality of sub-parts is connected to the first plane, and another end of each of the plurality of sub-parts extends in a direction away from the first plane.

The plurality of sub-parts include a central sub-part. A preset included angle is provided between an extending direction of the central sub-part and a boundary line between the corner curved surface and the side curved surfaces, and the preset included angle includes 45 degrees. In the bonding arc area, a mean radius of curvature of the central sub-part is greater than a mean radius of curvature of each of other sub-parts of the corner curved surface.

In one embodiment of the present disclosure, in the bonding arc area, a mean radius of curvature of each of the plurality of sub-parts decreases as a distance between each of the plurality of sub-parts and the central sub-part increases.

In one embodiment of the present disclosure, in the bonding arc area, the plurality of sub-parts further include a first sub-part, a second sub-part between the first sub-part and the side curved surfaces, and a third sub-part between the second sub-part and the side curved surfaces. In the same corner curved surface, a distance between the first sub-part and the central sub-part is less than a distance between the second sub-part and the central sub-part, and the distance between the second sub-part and the central sub-part is less than a distance between the third sub-part and the central sub-part.

A mean radius of curvature of the first sub-part is greater than a mean radius of curvature of the second sub-part, the mean radius of curvature of the second sub-part is greater than a mean radius of curvature of the third sub-part. A difference value between the mean radius of curvature of the first sub-part and the mean radius of curvature of the second sub-part is greater than a difference value between the mean radius of curvature of the second sub-part and the mean radius of curvature of the third sub-part.

In one embodiment of the present disclosure, the second sub-part is connected between the first sub-part and the third sub-part.

In one embodiment of the present disclosure, in the bonding arc area, a mean radius of curvature of the corner curved surface is greater than a mean radius of curvature of the side curved surfaces.

In one embodiment of the present disclosure, in the bonding arc area, a radius of curvature of the first curved surface is unchanged in a direction away from the first plane.

Or, in the bonding arc area, a radius of curvature of a side of the first curved surface away from the first plane is less than a radius of curvature of a side of the first curved surface close to the first plane.

In one embodiment of the present disclosure, the first curved surface further includes one or more non-bonding arc areas located at a side of the bonding arc area away from the first plane, and a mean radius of curvature of the first curved surface in the bonding arc area is greater than a mean radius of curvature of the first curved surface in the non-bonding arc areas.

The display panel is bonded to the first plane and the first curved surface located in the bonding arc area, and an edge of the display panel does not exceed a boundary line between the bonding arc area and the non-bonding arc areas.

In one embodiment of the present disclosure, the first curved surface comprises a plurality of non-bonding arc areas disposed on the side of the bonding arc area away from the first plane; in two adjacent non-bonding arc areas, the mean radius of curvature of the first curved surface in one of the non-bonding arc areas close to a side of the bonding arc area is greater than a mean radius of curvature of the first curved surface in one of the non-bonding arc areas away from the bonding arc area.

In one embodiment of the present disclosure, a number of the non-bonding arc areas of the corner curved surface is less than or equal to a number of the non-bonding arc areas of the side curved surfaces.

In one embodiment of the present disclosure, a number of the non-bonding arc areas of the corner curved surface away from the side curved surfaces connected thereof is less than a number of the non-bonding arc areas of the corner curved surface close to the side curved surfaces connected thereof.

In one embodiment of the present disclosure, in a direction away from the first plane along the bonding arc area, a changing rate of the radius of curvature of the first curved surface in the bonding arc area is less than a changing rate of the radius of curvature of the first curved surface in the two adjacent non-bonding arc areas.

In one embodiment of the present disclosure, the radius of curvature of the first curved surface in the bonding arc area is greater than or equal to 1.5 mm, and the radius of curvature of the first curved surface in the non-bonding arc areas is greater than or equal to 0.5 mm.

In one embodiment of the present disclosure, a side of the cover plate away from the display panel is provided with an external surface, and the external surface comprises a second plane opposite to the first plane and a second curved surface opposite to the first curved surface. The second plane is parallel to the first plane.

The second curved surface is parallel to the first curved surface, and a thickness of each part of the cover plate is equal.

Or, the second curved surface is not parallel to the first curved surface, the cover plate has a first thickness corresponding to the area where the corner curved surface is away from the side curved surfaces connected thereof, and the cover plate has a second thickness corresponding to an area where the corner curved surface is close to the side curved surfaces connected thereof; the first thickness is less than the second thickness.

In one embodiment of the present disclosure, a mean radius of curvature of the second curved surface is greater than or equal to the mean radius of curvature of the first curved surface.

In one embodiment of the present disclosure, an end of the first curved surface away from the first plane extends in a first direction, and an included angle between the first direction and a second direction is less than or equal to 90 degrees. The second direction is a direction pointing to the first curved surface along the first plane, and the second direction is parallel to the first plane.

Figure 3:
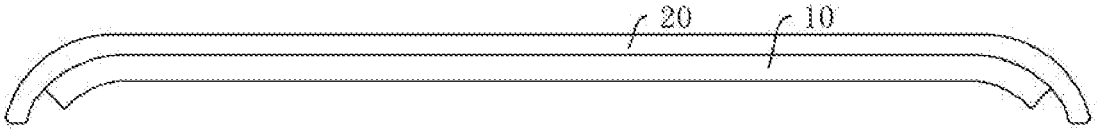
FIG. 3 is a structural schematic diagram of the display module provided by an embodiment of the present disclosure.

Specifically, referring to FIG. 1, FIG. 2, and FIG. 3, the display module includes the display panel 10 and the cover plate 20 stacked. The cover plate 20 is disposed on the light-emitting side of the display panel 10. A peripheral edge of the cover plate 20 bends toward the side of the display panel 10 to form a four curved cover plate. The display panel 10 is bonded to a plane part and a curved part of the cover plate 20 to form a four curved display module, thereby realizing a narrow frame display effect.

In one embodiment, the display panel 10 may include a panel body, a polarizer bonded between the panel body and the cover plate 20, a back plate disposed on a side of the panel body away from the cover plate 20, and a super clean foam (SCF) disposed on a side of the back plate away from the panel body.

Further, a side of the cover plate 20 close to the display panel 10 is provided with a bonding surface 30, and a side of the cover plate 20 away from the display panel 10 is provided with an external surface 40. In one embodiment, both an edge of the bonding surface 30 and an edge of the external surface 40 bend toward the side close to the display panel 10.

The bonding surface 30 includes a first plane 31 and a first curved surface 32 connected to a periphery of the first plane 31, and the display panel 10 is bonded to the first plane 31 and at least part of the first curved surface 32. A position where the display panel 10 is bonded to the first curved surface 32 forms a curved surface display part.

The radius of curvature of the corner curved surface 322 is designed differently in the embodiment of the present disclosure to improve the phenomenon of the wrinkles occurring during the bonding process between the display panel 10 and the cover plate 20.

Specifically, the first curved surface 32 includes a plurality of side curved surfaces 321 and a corner curved surface 322 connected between two adjacent side curved surfaces 321. In one embodiment, the first plane 31 may be a polygon, such as a rectangle. The side curved surfaces 321 are connected to sides of the first plane 31, and the corner curved surface 322 is connected to a corner between two sides of the first plane 31. The corner curved surface 322 is located between the two adjacent side curved surfaces 321.

In the embodiment of the present disclosure, the display panel 10 is bonded to the bonding arc area 201 and the first plane 31. In the bonding arc area 201, the mean radius of curvature of the corner curved surface 322 is greater than the mean radius of curvature of the side curved surfaces 321. Since the display panel 10 is more likely to produce wrinkles at the corners during the bonding process, the mean radius of curvature of the corner curved surface 322 is increased in the embodiment of the present disclosure, so that the compression amount can be reduced when the display panel 10 is bonded at the corner curved surface 322, thereby reducing the probability of wrinkles occurring of the display panel 10 at the corner curved surface 322.

Further, in the embodiment of the present disclosure, in the bonding arc area 201, the mean radius of curvature in the area where the corner curved surface 322 is away from the side curved surfaces 321 connected thereof is greater than the mean radius of curvature of the area where the corner curved surface 322 is close to the side curved surfaces 321 connected thereof, so that the closer to the center of the corner curved surface 322, the greater the mean radius of curvature of the corner curved surface 322, the smaller the compression amount of the display panel 10 during the bonding process, thereby effectively reducing the probability of wrinkles occurring of the display panel 10 at the corner, and improving the bonding yield of the display display 10.

Figure 4:
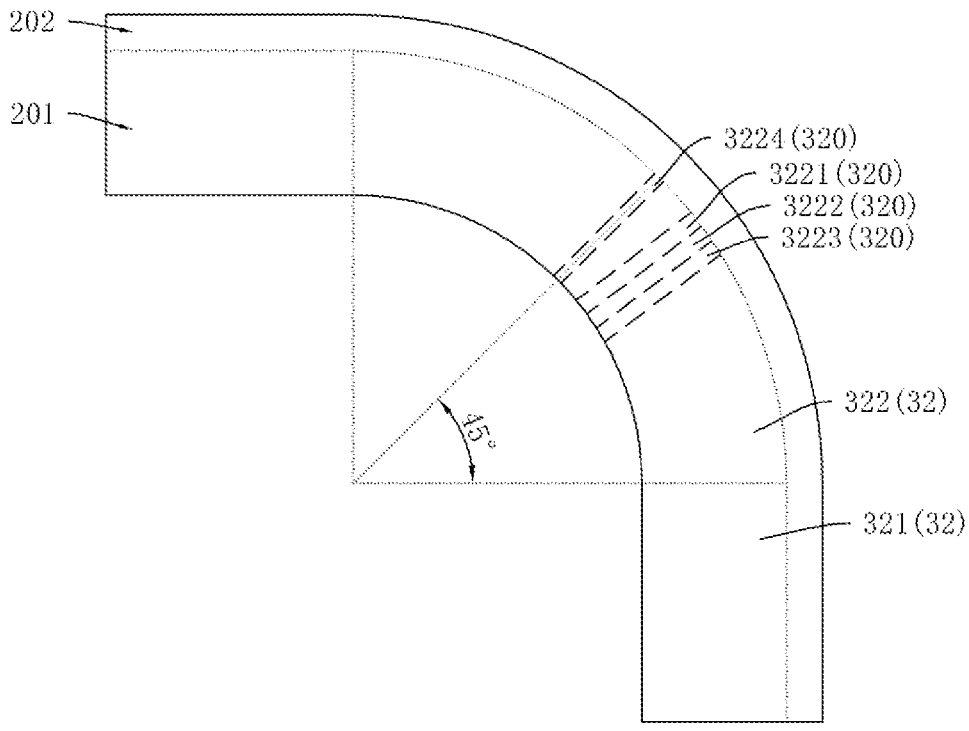
FIG. 4 is a structural schematic diagram of the cover plate at a first curved surface provided by an embodiment of the present disclosure.

Further, in one embodiment, continuing with FIG. 1, FIG. 2, and FIG. 4, the corner curved surface 322 includes a plurality of sub-parts 320. One end of each of the plurality of sub-parts 320 is connected to the first plane 31, and another end of each of the plurality of sub-parts 320 extends in a direction away from the first plane 31. The plurality of sub-parts 320 include a central sub-part 3224. One end of the central sub-part 3224 is connected to the first plane 31, and another end of the central sub-part 3224 extends in the direction away from the first plane 31. A preset included angle is provided between an extending direction of the central sub-part 3224 and a boundary line between the corner curved surface 322 and the side curved surfaces 321. In the bonding arc area 201, a mean radius of curvature of the central sub-part 3224 is greater than a mean radius of curvature of each of the other sub-parts 320 of the corner curved surface 322.

In one embodiment, the preset included angle is 45 degrees. An included angle between the same corner curved surface 322 and two boundary lines between the two side curved surfaces 321 may be 90 degrees. The corner curved surface 322 has a maximum mean radius of curvature at the position where the included angle between an extending direction of the corner curved surface 322 and the boundary line between the corner curved surface 322 and the side curved surfaces 321 is 45 degrees.

In other embodiments of the present disclosure, the preset included angle may further include any angle other than 0 degrees and 360 degrees. The embodiment of the present disclosure is described by taking the preset included angle being 45 degrees as an example.

In one embodiment, in the bonding arc area 201, a radius of curvature of each of the plurality of sub-parts 320 decreases as a distance from each of the plurality of sub-parts 320 to the central sub-part 3224 increases. It can be understood that the distance from each of the plurality of sub-parts 320 of the corner curved surface 322 to the central sub-part 3224 may be a central arc length along a corner sector area in a top view.

It should be noted that the mean radius of curvature of the corner curved surface 322 gradually increases from the edge of the corner to the center of the corner, and the degree of increase can be larger and larger. That is, a changing rate of the mean radius of curvature can be larger and larger. Since the closer to the center of the corner, the compression amount of the display panel 10 during the bonding process may be larger and larger. For example, a Gaussian surface needs to be bonded. In the embodiment of the present disclosure, by increasing the changing rate of the mean radius of curvature of the corner curved surface 322, the closer to the center of the corners, the faster the mean radius of curvature of the corner curved surface 322 increases, thereby more effectively reducing the probability of wrinkles occurring of the display panel 10 at the corners.

Specifically, in one embodiment, referring to FIG. 1, FIG. 2, and FIG. 4, in the bonding arc area 201, the plurality of sub-parts further include a first sub-part 3221, a second sub-part 3222, and a third sub-part 3223. In the corner curved surface 322, the second sub-part 3222 is located between the first sub-part 3221 and the side curved surfaces 321, and the third sub-part 3223 is located between the second sub-part 3222 and the side curved surfaces 321. A distance between the first sub-part 3221 and the central sub-part 3224 is less than a distance between the second sub-part 3222 and the central sub-part 3224, and the distance between the second sub-part 3222 and the central sub-part 3224 is less than a distance between the third sub-part 3223 and the central sub-part 3224.

Further, a mean radius of curvature of the first sub-part 3221 is greater than a mean radius of curvature of the second sub-part 3222, and the mean radius of curvature of the second sub-part 3222 is greater than a mean radius of curvature of the third sub-part 3223. A difference value between the mean radius of curvature of the first sub-part 3221 and the mean radius of curvature of the second sub-part 3222 is greater than a difference value between the mean radius of curvature of the second sub-part 3222 and the mean radius of curvature of the third sub-part 3223. The second sub-part 3222 can be directly connected between the first sub-part 3221 and the third sub-part 3223, indicating that the mean radius of curvature of the corner curved surface 322 increases faster at the position closer to the center of the corner, thereby more effectively reducing the probability of wrinkles occurring of the display panel 10 at the corners.

It should be noted that in the bonding arc area 201, the first sub-part 3221, the second sub-part 3222, and the third sub-part 3223 are only three sub-parts 320 connected in the corner curved surface 322. A relationship between the mean radius of curvature of the plurality of sub-part 320 can be set according to the first sub-part 3221, the second sub-part 3222, and the third sub-part 3223.

Figure 6:
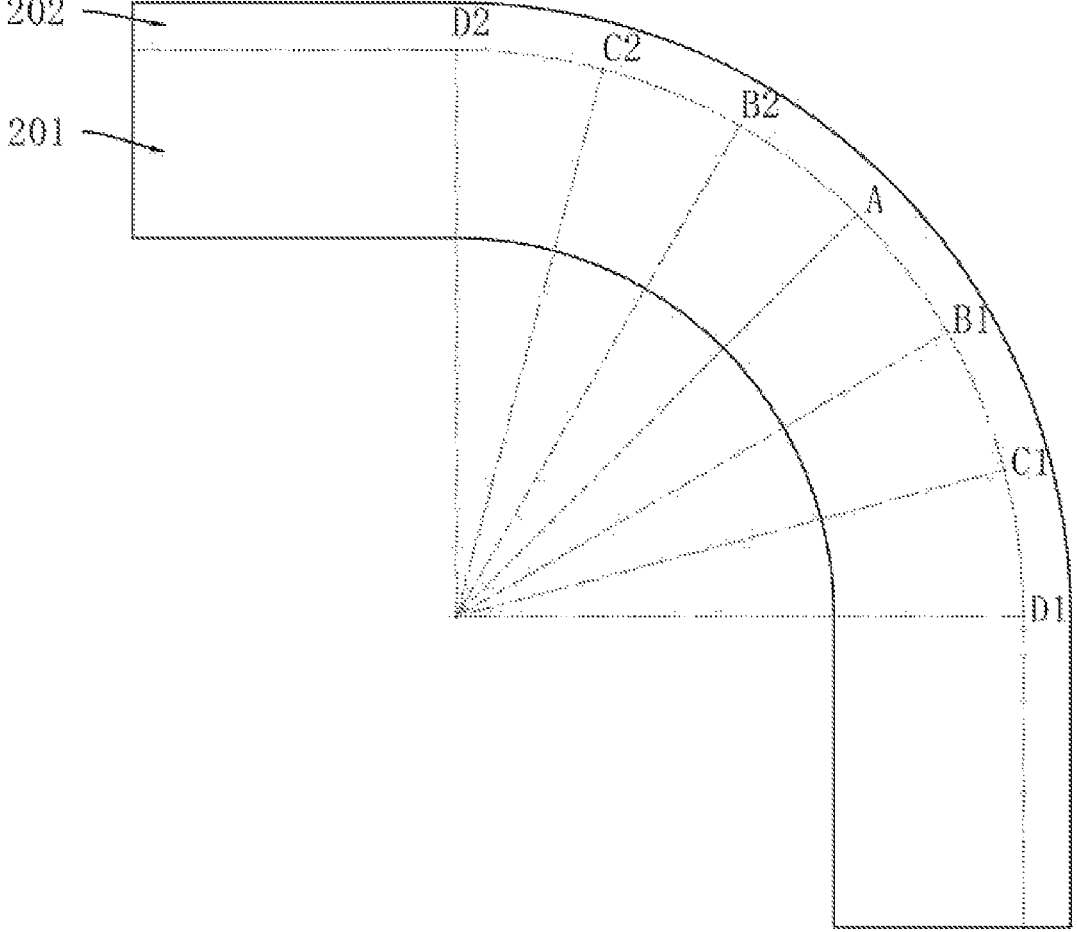
FIG. 6 is a schematic diagram of distribution of a radius of curvature at the first curved surface of the cover plate provided by an embodiment of the present disclosure.

In one embodiment, referring to FIG. 1, FIG. 2, and FIG. 6, in the bonding arc area 201, a changing curve of the mean radius of curvature of the corner curved surface 322 changes smoothly. The corner curved surface 322 includes a first position A, second positions B1 and B2, third positions C1 and C2, and fourth positions D1 and D2. Between the fourth position D1 and the first position A, the mean radius of curvature of the corner curved surface 322 gradually increases, and the changing rate of the mean radius of curvature also gradually increases. Between the first position A and the fourth position D2, the mean radius of curvature of the corner curved surface 322 gradually decreases, and the changing rate of the mean radius of curvature also gradually decreases. The mean radius of curvature of the fourth positions D1 and D2 may be equal to the mean radius of curvature of the side curved surfaces 321. Further, an included angle between the third position C1 and the fourth position D1, an included angle between the second position B1 and the third position C1, an included angle between the first position A and the second position B1, an included angle between the first position A and the second position B2, an included angle between the second position B2 and the third position C2, and an included angle between the third position C2 and the fourth position D2 can all be 15 degrees.

Figure 5:
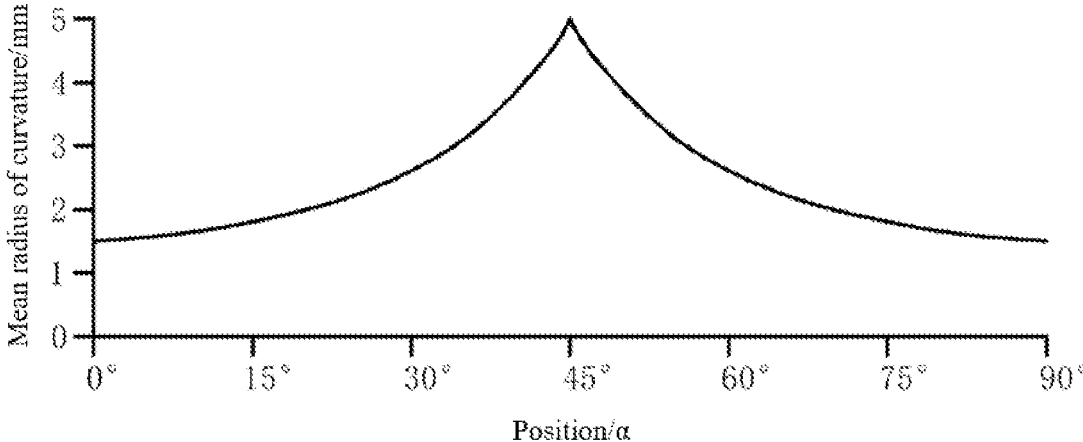
FIG. 5 is a diagram of a changing curve of curvature of a corner curved surface in a bonding arc area provided by an embodiment of the present disclosure.

A width of each of the sub-parts 320 can be selected according to actual requirements. In the embodiment of the present disclosure, a length of each of the sub-parts 320 in an extending direction along an arc length of the sector area of the corner in the top view may be sufficiently small, so that the changing curve of the mean radius of curvature of the corner curved surface 322 changes smoothly. As shown in FIG. 5, the ordinate represents the mean radius of curvature of the corner curved surface 322, and the abscissa represents different positions of the corner curved surface 322. Referring to FIG. 4 and FIG. 5, a position with the ordinate of 0° can be the fourth position D1. The position with the ordinate of α can be an included angle between other positions of the corner curved surface 322 and the fourth position D1. For example, a position with 15° can be the third position C1, a position with 30° can be the second position B1, a position with 45° can be the first position A, a position with 60° can be the second position B2, a position with 75° can be the third position C2, and a position with 90° can be the fourth position D2. Further, peak of the curve corresponds to the mean radius of curvature of the corner curved surface 322 at the center of the corner, and valleys on both sides of the curve correspond to the mean radius of curvature of the corner curved surface 322 close to the side curved surfaces 321, thereby improving the bonding effect between the display panel 10 and the cover plate 20 and the display effect of the display module. It can be seen that a slope of the curve in FIG. 5 gradually increases in the direction close to the center of the corner. That is, the changing rate of the radius of curvature gradually increases in the direction close to the center of the corner, so as to further reduce the compression amount of the display panel 10 close to the center of the corner and reduce the probability of wrinkling during the bonding process of display panel 10.

In summary, in the embodiment of the present disclosure, the mean radius of curvature of the corner curved surface 322 is increased to reduce the probability of wrinkling at the corner of the display panel 10 during the bonding process. At the same time, the mean radius of curvature of the corner curved surface 322 is gradually increased from the edge of the corners toward the center of the corner, so as to further reduce the compression amount of the display panel 10 at the corner. The compression amount of the display panel 10 is gradually changed and increased from the side curved surfaces 321 to the corner curved surface 322 and from the edges of the corner curved surface 322 to the center of the corner curved surface 322. On basis of reducing the probability of the bonding wrinkling of the display panel 10, a poor bonding and optical abnormality caused by a sudden change of the cover plate topography during the bonding process the display panel 10 are avoided, thereby improving the yield and display effect of the display module.

Further, in the embodiment of the present disclosure, the mean radius of curvature of the corner curved surface 322 in the bonding arc area 201 is increased to reduce the probability of wrinkling during the bonding process of display panel 10. However, the mean radius of curvature of the corner curved surface 322 is increased, which may lead to an increase of a size of the edges of the cover plate 20, and an increase of the frame width of the display module, which will not be conducive to realizing the narrow frame of the four curved display module. Therefore, the first curved surface 32 adopts a segmented arc design in the embodiment of the present disclosure.

Specifically, referring to FIG. 1 and FIG. 2, the first curved surface 32 further includes one or more non-bonding arc areas 202 located at a side of the bonding arc area 201 away from the first plane 31. A mean radius of curvature R1 of the first curved surface 32 in the bonding arc area 201 is greater than a mean radius of curvature R2 of the first curved surface 32 in the non-bonding arc areas 202.

In one embodiment of the present disclosure, the external surface 40 includes a second plane 41 opposite to the first plane 31 and a second curved surface 42 opposite to the first curved surface 32. An end of the second curved surface 42 is connected to the second plane 41, and another end of the second curved surface 42 bends in the direction close to the display panel 10. The second plane 41 is parallel to the first plane 31, and the second curved surface 42 is parallel to the first curved surface 32, so that a mean radius of curvature of the second curved surface 42 is equal to the mean radius of curvature of the first curved surface 32. A thickness of the cover plate 20 is uniform at the first curved surface 32, and the thickness of the cover plate 20 is equal everywhere.

It can be understood that since the mean radius of curvature of the cover plate 20 in the bending area 201 is greater than the mean radius of curvature of the cover plate 20 in the non-bending area 202, and the mean radius of curvature of the second curved surface 42 is equal to the mean radius of curvature of the first curved surface 32, the second curved surface 42 at a position with a larger mean radius of curvature will protrude in the direction away from the display panel 10 relative to a position with a smaller mean radius of curvature. For example, the second curved surface 42 corresponding to the area where the corner curved surface 322 is away from the side curved surfaces 321 connected thereof will protrude in the direction away from the display panel 10 relative to the second curved surface 42 corresponding to the area where the corner curved surface 322 is close to the side curved surfaces 321 connected thereof.

Further, the display panel 10 is bonded to the first plane 31 and the bonding arc area 201. That is, the display panel 10 is bonded to the position where the radius of curvature of the first curved surface 32 is larger. The radius of curvature of the non-bonding arc area 202 is reduced relative to the bonding arc area 201. That is, the radius of curvature of the second curved surface 42 away from the second plane 41 is also reduced, thereby reducing the edge size of the cover plate 20, and reducing the frame width of the display module, which is conducive to realizing the narrow frame of the four curved display module.

An edge of the display panel 10 does not exceed a boundary line between the bonding arc area 201 and the non-bonding arc areas 202. A distance of the arc length from the edge of the display panel 10 to the boundary line between the bonding arc area 201 and the non-bonding arc area 202 is greater than or equal to 0.25 mm.

It can be understood that a number of non-bonding arc areas 202 may be a plurality, and a plurality of the non-bonding arc areas 202 are arranged along a direction of the first plane 31 close to the bonding arc area 201. Between two adjacent non-bonding arc areas 202, the mean radius of curvature of the first curved surface 32 in one of the non-bonding arc areas 202 close to the bonding arc areas 201 is greater than the mean radius of curvature of the first curved surface 32 in one of the non-bonding arc areas 202 away from the bonding arc areas 201. That is, the mean radius of curvature of the plurality of the non-bonding arc areas 202 gradually decreases along the direction of the bonding arc area 201 close to the non-bonding arc areas 202, so that the edges of the cover plate 20 can be deflected to a vertical direction as soon as possible, thereby reducing the edge size of the cover plate 20, reducing the frame width of the display module, which is conducive to realizing the narrow frame of the four curved display module.

In one embodiment, when the size of each of the non-bonding arc areas 202 in the direction away from the first plane 31 are sufficiently small, the radius of curvature of the first curved surfaces 32 in the plurality of non-bonding arc areas 202 in the direction away from the first plane 31 is gradually decreased.

Optionally, one end of the first curved surface 32 away from the first plane 31 extends in a first direction M, and an included angle between the first direction M and the second direction N is less than or equal to 90 degrees. The second direction N is a direction pointing to the first curved surface 32 along the first plane 31, and the second direction N is parallel to the first plane 31. When the included angle between the first direction M and the second direction N is 90 degrees, the edges of the cover plate 20 will no longer extend outward, but will transition from a curved surface to a vertical state, thereby improving a grip feeling of the display panel.

In one embodiment, a number of the non-bonding arc areas 202 at the corner curved surface 322 is less than or equal to a number of the non-bonding arc areas 202 at the side curved surfaces 321, so that the mean radius of curvature of the side curved surfaces 321 can be reduced more quickly, thereby more effectively reducing the frame width of the display module at each side edge and realizing the narrow frame of the display module.

Further, a number of the non-bonding arc areas 322 at the corner curved surface 322 away from the side curved surfaces 321 connected thereof is less than a number of the non-bonding arc areas 321 at the corner curved surface 322 close to the side curved surfaces 322 connected thereof, so that the frame width of the display module can be gradually changed from the corner to the sides, thereby avoiding a phenomenon of uneven stress and poor appearance caused by the sudden change of the frame width.

It should be noted that, in the embodiment of the present disclosure, the radius of curvature of the first curved surface 32 in the bonding arc area 201 is constant in the direction away from the first plane 31. That is, the radius of curvature of the first curved surface 32 in the bonding arc area 201 is uniform in the direction away from the first plane 31, so that the bonding yield of the display panel 10 in the bonding arc area 201 can be effectively improved. Or, in the bonding arc area 201, the radius of curvature of the first curved surface 32 at the side away from the first plane 31 is less than the radius of curvature of the first curved surface 32 at the side close to the first plane 31, and the radius of curvature of the first curved surface 32 in the bonding arc area 201 gradually decreases in the direction away from the first plane 31. In the direction away from the first plane 31, a changing rate of the radius of curvature of the first curved surface 32 in the bonding arc area 201 is less than a changing rate of the radius of curvature of the first curved surface 32 in the adjacent two non-bonding arc areas 202.

Further, when the radius of curvature of the corner curved surface 322 in the bonding arc area 201 is equal, the mean radius of curvature of the corner curved surface 322 in the bonding arc area 201 can refer to the radius of curvature of the corner curved surface 322 at any position in the bonding arc area 201. When the radius of curvature of the corner curved surface 322 in the bonding arc area 201 is uneven, the mean radius of curvature of the corner curved surface 322 in the bonding arc area 201 may be an average value of the radius of curvature of the corner curved surface 322 in the bonding arc area 201.

It can be understood that a principle of the mean radius of curvature defined in the non-bonding arc areas 202 and the second curved surface 42 is the same as a principle of the mean radius of curvature defined in the bonding arc area 201 and will not be repeated herein.

In the embodiment of the present disclosure, the compression amount of the display panel 10 at the first curved surface 32 is reduced by increasing the mean radius of curvature of the first curved surface 32 bonded to the display panel 10. At the same time, the mean radius of curvature of the corner curved surface 322 is greater than the mean radius of curvature of the side curved surfaces 321, and the mean radius of curvature of the corner curved surface 322 is gradually increased from the edge of the corner to the center of the corner, so as to further reduce the compression amount of the display panel 10 at the corner curved surface 322, thereby reducing the probability of the bonding wrinkling of the display panel 1 at the first curved surface 32, especially, at the corner curved surface 322, and improving the yield of the display panel. At the same time, in the embodiment of the present disclosure, by disposing the bonding arc area 201 with a larger mean radius of curvature and a non-bonding arc area 201 with a smaller mean radius of curvature at the first curved surface 32, thereby improving the bonding wrinkles of the display module, reducing the frame width of the display module, and realizing a narrow frame display module.

Further, in another embodiment of the present disclosure, the second curved surface 41 is parallel to the first plane 31, the second curved surface 42 is not parallel to the first curved surface 32, and the mean radius of curvature of the second curved surface 42 is greater than or equal to the mean radius of curvature of the first curved surface 32. Specifically, the mean radius of curvature of the second curved surface 42 may be equal to the mean radius of curvature of the first curved surface 32 in the bonding arc area 201, and the mean radius of curvature of the second curved surface 42 may be greater than the mean radius of curvature of the first curved surface 32 in the non-bonding arc areas 202, and the radius of curvature of the second curved surface 42 is uniform.

It should be noted that, in this embodiment, the cover plate 20 has a first thickness corresponding to the corner curved surface 322 away from the side curved surfaces 321 connected thereof. The cover plate 20 has a second thickness corresponding to the corner curved surface 322 close to the side curved surfaces 321 connected thereof. The first thickness is less than the second thickness. Further, a thickness of the cover plate 20 located in the non-bonding arc areas 202 is greater than a thickness of the cover plate 20 in other areas. That is, the smaller the radius of curvature corresponding to the first curved surface 32, the greater the thickness of the cover plate 20. A part where the thickness of the cover plate 20 increases in the non-bonding arc areas 202 is located on the side of the cover plate 20 close to the display panel 10, so that the second curved surface 42 of the cover plate 20 can maintain uniform curvature, which is beneficial to improving the appearance effect and holding effect of the display panel.

In addition, since the radius of curvature of the second curved surface 42 is consistent, and the radius of curvature of the first curved surface 32 in the non-bonding arc areas 202 is decreased, the thickness of the cover plate 20 in the non-bonding arc areas 202 can be increased, which can improve a protection effect of the cover plate 20 on the side curved surfaces of the display module.

In one embodiment, the radius of curvature of the first curved surface 32 in the bonding arc area 201 is greater than or equal to 1.5 mm, and the radius of curvature of the first curved surface 32 in the non-bonding arc areas 202 is greater than or equal to 0.5 mm.

Further, the radius of curvature of the first curved surface 32 in the bonding arc area 201 is greater than or equal to 3 mm and less than or equal to 5 mm. The radius of curvature of the first curved surface 32 in the non-bonding arc areas 202 is greater than or equal to 1 mm. Referring to FIG. 1 and FIG. 6, the radius of curvature of the corner curved surface 322 in the bonding arc area 201 at the first position A is greater than or equal to 3.3 mm.

In addition, the embodiment of the present disclosure further provides a display device including the display module described in the embodiments mentioned above.

In one embodiment, the display device may include a mobile phone, a television, a computer, a tablet, and other large-screen display devices.

In summary, in the embodiment of the present disclosure, the mean radius of curvature of the corner curved surface 322 is increased to reduce the probability of wrinkling at the corner of the display panel 10 during the bonding process. At the same time, the mean radius of curvature of the corner curved surface 322 is gradually increased from the edge of the corners toward the center of the corner, so as to further reduce the compression amount of the display panel 10 at the corner. The compression amount of the display panel 10 is gradually changed and increased from the side curved surfaces 321 to the corner curved surface 322 and from the edges of the corner curved surface 322 to the center of the corner curved surface 322. On basis of reducing the probability of the bonding wrinkling of the display panel 10, a poor bonding and optical abnormality caused by a sudden change of the cover plate topography during the bonding process the display panel 10 are avoided, thereby improving the yield and display effect of the display module.

In the foregoing embodiments, the description of each of the embodiments has respective focuses. For a part that is not described in detail in an embodiment, reference may be made to relevant descriptions in other embodiments. Details are not further described herein.

The display module and the display device provided in the embodiments of the present disclosure are described in detail above. The principle and implementations of the present disclosure are described in this specification by using specific examples. The description about the foregoing embodiments is merely provided to help understand the method and core ideas of the present disclosure. Persons of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. A display module, comprising:

a display panel; and a cover plate, disposed on a side of the display panel, wherein a side of the cover plate close to the display panel is provided with a bonding surface that comprises a first plane and a first curved surface connected to a periphery of the first plane, and the display panel is bonded with the first plane and the first curved surface;

wherein one end of the first curved surface is connected to the first plane, and another end of the first curved surface bends toward a side close to the display panel; the first curved surface comprises a plurality of side curved surfaces and a corner curved surface connected between two adjacent side curved surfaces, and a side of the first curved surface close to the first plane is provided with a bonding arc area; in the bonding arc area, a mean radius of curvature of the corner curved surface bending toward the display panel increases from two areas of the corner curved surface adjacently joined with the two adjacent side curved surfaces along a direction approaching a center of the corner curved surface.

2. The display module according to claim 1, wherein in the bonding arc area, a mean radius of curvature of the corner curved surface is greater than a mean radius of curvature of the side curved surfaces.

3. The display module according to claim 1, wherein in the bonding arc area, a radius of curvature of the first curved surface is unchanged in a direction away from the first plane; or, in the bonding arc area, a radius of curvature of a side of the first curved surface away from the first plane is less than a radius of curvature of a side of the first curved surface close to the first plane.

4. The display module according to claim 3, wherein the first curved surface further comprises one or more non-bonding arc areas located at a side of the bonding arc area away from the first plane, and a mean radius of curvature of the first curved surface in the bonding arc area is greater than a mean radius of curvature of the first curved surface in the non-bonding arc areas; and wherein the display panel is bonded to the first plane and the first curved surface located in the bonding arc area, and an edge of the display panel does not exceed a boundary line between the bonding arc area and the non-bonding arc areas.

5. The display module according to claim 4, wherein the first curved surface comprises a plurality of non-bonding arc areas disposed on the side of the bonding arc area away from the first plane; in two adjacent non-bonding arc areas, the mean radius of curvature of the first curved surface in one of the non-bonding arc areas close to a side of the bonding arc area is greater than a mean radius of curvature of the first curved surface in one of the non-bonding arc areas away from the bonding arc area.

6. The display module according to claim 5, wherein a number of the non-bonding arc areas of the corner curved surface is less than or equal to a number of the non-bonding arc areas of the side curved surfaces.

7. The display module according to claim 5, wherein a number of the non-bonding arc areas of the corner curved surface away from the side curved surfaces connected thereof is less than a number of the non-bonding arc areas of the corner curved surface close to the side curved surfaces connected thereof.

8. The display module according to claim 5, wherein in a direction away from the first plane along the bonding arc area, a changing rate of the radius of curvature of the first curved surface in the bonding arc area is less than a changing rate of the radius of curvature of the first curved surface in the two adjacent non-bonding arc areas.

9. The display module according to claim 4, wherein the radius of curvature of the first curved surface in the bonding arc area is greater than or equal to 1.5 mm, and the radius of curvature of the first curved surface in the non-bonding arc areas is greater than or equal to 0.5 mm.

10. The display module according to claim 1, wherein a side of the cover plate away from the display panel is provided with an external surface, and the external surface comprises a second plane opposite to the first plane and a second curved surface opposite to the first curved surface; the second plane is parallel to the first plane;

the second curved surface is parallel to the first curved surface, and a thickness of each part of the cover plate is equal; or, the second curved surface is not parallel to the first curved surface, the cover plate has a first thickness corresponding to the area where the corner curved surface is away from the side curved surfaces connected thereof, and the cover plate has a second thickness corresponding to an area where the corner curved surface is close to the side curved surfaces connected thereof; the first thickness is less than the second thickness.

11. The display module according to claim 10, wherein a mean radius of curvature of the second curved surface is greater than or equal to the mean radius of curvature of the first curved surface.

12. The display module according to claim 1, wherein an end of the first curved surface away from the first plane extends in a first direction, and an included angle between the first direction and a second direction is less than or equal to 90 degrees; the second direction is a direction pointing to the first curved surface along the first plane, and the second direction is parallel to the first plane.

13. A display module, comprising:

a display panel; and a cover plate, disposed on a side of the display panel, wherein a side of the cover plate close to the display panel is provided with a bonding surface that comprises a first plane and a first curved surface connected to a periphery of the first plane, and the display panel is bonded with the first plane and the first curved surface;

wherein one end of the first curved surface is connected to the first plane, and another end of the first curved surface bends toward a side close to the display panel; the first curved surface comprises a plurality of side curved surfaces and a corner curved surface connected between two adjacent side curved surfaces, and a side of the first curved surface close to the first plane is provided with a bonding arc area; in the bonding arc area, a mean radius of curvature in an area where the corner curved surface is away from the side curved surfaces connected thereof is greater than a mean radius of curvature of an area where the corner curved surface is close to the side curved surfaces connected thereof;

wherein in the bonding arc area, the corner curved surface comprises a plurality of sub-parts; one end of each of the plurality of sub-parts is connected to the first plane, and another end of each of the plurality of sub-parts extends in a direction away from the first plane;

wherein the plurality of sub-parts comprise a central sub-part; a preset included angle is provided between an extending direction of the central sub-part and a boundary line between the corner curved surface and the side curved surfaces, and the preset included angle comprises 45 degrees; in the bonding arc area, a mean radius of curvature of the central sub-part is greater than a mean radius of curvature of each of other sub-parts of the corner curved surface.

14. The display module according to claim 13, wherein in the bonding arc area, a mean radius of curvature of each of the plurality of sub-parts decreases as a distance between each of the plurality of sub-parts and the central sub-part increases.

15. The display module according to claim 13, wherein in the bonding arc area, the plurality of sub-parts further comprise a first sub-part, a second sub-part between the first sub-part and the side curved surfaces, and a third sub-part between the second sub-part and the side curved surfaces; in the same corner curved surface, a distance between the first sub-part and the central sub-part is less than a distance between the second sub-part and the central sub-part, and the distance between the second sub-part and the central sub-part is less than a distance between the third sub-part and the central sub-part; and wherein a mean radius of curvature of the first sub-part is greater than a mean radius of curvature of the second sub-part, the mean radius of curvature of the second sub-part is greater than a mean radius of curvature of the third sub-part; a difference value between the mean radius of curvature of the first sub-part and the mean radius of curvature of the second sub-part is greater than a difference value between the mean radius of curvature of the second sub-part and the mean radius of curvature of the third sub-part.

16. The display module according to claim 15, wherein the second sub-part is connected between the first sub-part and the third sub-part.

17. A display device comprising a display module, the display module comprising:

a display panel; and a cover plate, disposed on a side of the display panel, wherein a side of the cover plate close to the display panel is provided with a bonding surface that comprises a first plane and a first curved surface connected to a periphery of the first plane, and the display panel is bonded with the first plane and the first curved surface;

wherein one end of the first curved surface is connected to the first plane, and another end of the first curved surface bends toward a side close to the display panel; the first curved surface comprises a plurality of side curved surfaces and a corner curved surface connected between two adjacent side curved surfaces, and a side of the first curved surface close to the first plane is provided with a bonding arc area; in the bonding arc area, a mean radius of curvature of the corner curved surface bending toward the display panel increases from two areas of the corner curved surface adjacently joined with the two adjacent side curved surfaces along a direction approaching a center of the corner curved surface.

18. The display device according to claim 17, wherein in the bonding arc area, a radius of curvature of the first curved surface is unchanged in a direction away from the first plane; or, in the bonding arc area, a radius of curvature of a side of the first curved surface away from the first plane is less than a radius of curvature of a side of the first curved surface close to the first plane.

19. The display device according to claim 18, wherein the first curved surface further comprises one or more non-bonding arc areas located at a side of the bonding arc area away from the first plane, and a mean radius of curvature of the first curved surface in the bonding arc area is greater than a mean radius of curvature of the first curved surface in the non-bonding arc areas; and wherein the display panel is bonded to the first plane and the first curved surface located in the bonding arc area, and an edge of the display panel does not exceed a boundary line between the bonding arc area and the non-bonding arc areas.

20. The display device according to claim 19, wherein the first curved surface comprises a plurality of non-bonding arc areas disposed on the side of the bonding arc area away from the first plane; in two adjacent non-bonding arc areas, the mean radius of curvature of the first curved surface in one of the non-bonding arc areas close to a side of the bonding arc area is greater than a mean radius of curvature of the first curved surface in one of the non-bonding arc areas away from the bonding arc area.

* * * * *